(12) United States Patent
Peeters et al.

(10) Patent No.: US 10,439,110 B2
(45) Date of Patent: Oct. 8, 2019

(54) MEAT LIGHTING SYSTEM WITH IMPROVED EFFICIENCY AND RED OVERSATURATION

(71) Applicant: SIGNIFY HOLDING B.V., Eindhoven (NL)

(72) Inventors: Martinus Petrus Joseph Peeters, Eindhoven (NL); Rémy Cyrille Broersma, Eindhoven (NL); René Jan Hendriks, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/753,658

(22) PCT Filed: Aug. 16, 2016

(86) PCT No.: PCT/EP2016/069419
§ 371 (c)(1),
(2) Date: Feb. 20, 2018

(87) PCT Pub. No.: WO2017/036789
PCT Pub. Date: Mar. 9, 2017

(65) Prior Publication Data
US 2018/0248084 A1 Aug. 30, 2018

(30) Foreign Application Priority Data
Sep. 1, 2015 (EP) ..................... 15183250

(51) Int. Cl.
*H01L 33/50* (2010.01)
*F21K 9/64* (2016.01)
(Continued)

(52) U.S. Cl.
CPC ........ *H01L 33/504* (2013.01); *C09K 11/0883* (2013.01); *F21K 9/64* (2016.08);
(Continued)

(58) Field of Classification Search
CPC ... H01L 33/504; H01L 33/502; H01L 33/501; H01L 33/50–508
See application file for complete search history.

(56) References Cited

U.S. PATENT DOCUMENTS

2010/0289044 A1 11/2010 Krames et al.
2011/0222277 A1* 9/2011 Negley ................. H01L 33/504
362/235

(Continued)

FOREIGN PATENT DOCUMENTS

| EP | 2455969 A2 | 5/2012 |
| WO | WO2014024138 A1 | 2/2014 |
| WO | WO2014068440 A1 | 5/2014 |

OTHER PUBLICATIONS

P.J.M. van der Burgt, et al., "About Color Rendition of Light Sources. The Balance Between Simplicity and Accuracy", Color Research & Appliation, vol. 35, Issue 2, pp. 85-93, Apr. 2010, Philips Lighting, The Netherlands.

*Primary Examiner* — Changhyun Yi
(74) *Attorney, Agent, or Firm* — Daniel J. Piotrowski

(57) ABSTRACT

The invention provides a lighting system (100), configured to provide lighting system light (101), the lighting system comprising: —a light source (10) configured to provide light source light (11) with light intensity in the blue spectral region; —a first luminescent material (210) configured to convert at least part of the light source light (11) into first luminescent material light (211) with light intensity in the green spectral region and having a full width half maximum (FWHM) of at least 90 nm; —a second luminescent material (220) configured to convert (i) at least part of the light source light (11), or (ii) at least part of the light source light (11) and at least part of the first luminescent material light (211) into second luminescent material light (221) with light intensity in the spectral region of 610-680 nm; wherein the lighting (Continued)

system (100) is configured to provide at a first setting of the lighting system (100) lighting system light (101) comprising said light source light (11), said first luminescent material light (211) and said second luminescent material light (221) having a color point (x; y) with x=0.38±0.1 and with y=0.28±0.1.

13 Claims, 3 Drawing Sheets

(51) Int. Cl.
*H01L 25/075* (2006.01)
*F21V 9/30* (2018.01)
*C09K 11/08* (2006.01)
*F21V 9/38* (2018.01)
*F21Y 115/10* (2016.01)

(52) U.S. Cl.
CPC ............... *F21V 9/30* (2018.02); *F21V 9/38* (2018.02); *H01L 25/0753* (2013.01); *F21Y 2115/10* (2016.08)

(56) References Cited

U.S. PATENT DOCUMENTS

| | | |
|---|---|---|
| 2013/0277694 A1 | 10/2013 | Sakuta et al. |
| 2014/0116079 A1 | 5/2014 | Murphy et al. |
| 2015/0054007 A1 | 2/2015 | Edaka |
| 2018/0139817 A1* | 5/2018 | Yamakawa ........ H05B 33/0857 |

\* cited by examiner

MEAT LIGHTING SYSTEM WITH IMPROVED EFFICIENCY AND RED OVERSATURATION

CROSS-REFERENCE TO PRIOR APPLICATIONS

This application is the U.S. National Phase application under 35 U.S.C. § 371 of International Application No. PCT/EP2016/069419, filed on Aug. 16, 2016, which claims the benefit of European Patent Application No. 15183250.8, filed on Sep. 1, 2015. These applications are hereby incorporated by reference herein.

FIELD OF THE INVENTION

The invention relates to a lighting system and to the use of such lighting system for illuminating e.g. meat.

BACKGROUND OF THE INVENTION

Food lighting is known in the art. US2015054007, for instance, describes a food lighting device comprising: a blue LED element emitting light having a blue wavelength; a green phosphor having an emission peak wavelength of not more than 560 nm and an emission spectrum with a half width of not more than 80 nm; and a red LED element or a red phosphor emitting red light having an emission peak wavelength of at least 620 nm and less than 680 nm and an emission spectrum with a half width of not more than 40 nm, wherein the blue LED element, the green phosphor, and the red LED element or the red phosphor are selected such that light synthesized by the blue LED element, the green phosphor, and the red LED element or the red phosphor becomes white light whose wavelength component in a vicinity of 580 nm or in a vicinity of 600 nm is reduced. The green phosphor comprises one selected from β-sialon or $(Ba,Sr)_2SiO_4$:Eu.

US2013/277694 describes a semiconductor light-emitting device which emits light with high chroma, and an exhibit-irradiating illumination device, a meat-irradiating illumination device, a vegetable-irradiating illumination device, a fresh fish-irradiating illumination device, a general-purpose illumination device, and a semiconductor light-emitting system which include the semiconductor light-emitting device. A semiconductor light-emitting device 1 comprises an LED chip 10 as a semiconductor light-emitting element and a phosphor 20 which uses the LED chip 10 as an excitation source to emit light. The phosphor contains at least a green phosphor and a red phosphor, and a value of intensity of light with a wavelength of 660 nm in a spectrum of beam-normalized light emitted from the semiconductor light-emitting device 1 is 170% or more and 300% or less of a value of intensity of light with a wavelength of 660 nm in a spectrum of beam-normalized reference light for color rendering evaluation.

SUMMARY OF THE INVENTION

Oversaturation of red is desired for meat lighting. The oversaturation obtainable using a narrow green phosphor, in combination with a red nitride phosphor (such as $CaAlSiN_3$:Eu), appears to be limited. To further enhance the red saturation, a color filter can be applied. This color filter appears to provide best results when it absorbs some of the light around 580 nm; as a result a dip in the spectrum between green and red is introduced leading to an increased red saturation at the expense of a decreasing lumen equivalent. Not only the lumen equivalent will decrease but also the radiometric power will decrease. A suitable filter material appears to be neodymium (Nd) dissolved in glass. Hence, though such options provide solutions to the problem of providing a lighting system that can oversaturate red, such as in the case of meat lighting, these options suffer from unnecessary efficiency loss and/or a relative low oversaturation of the red.

Hence, it is an aspect of the invention to provide an alternative lighting system (or device), which preferably further at least partly obviates one or more of above-described drawbacks. In view of the above it is (also) desirable to provide a lighting system which is able to generate a whitish light spectrum with an improved red saturation index (RSI) and/or an improved lumen efficiency, especially with a more optimal red saturation index and lumen efficiency relation than some of the above indicated alternative solutions.

It is herein proposed to use a narrow red(dish) emitting luminescent material, emitting substantially in the spectral region of 610-680 nm, and substantially not in the yellow, such as e.g. $K_2SiF_6$:$Mn^{4+}$ phosphor, in combination with a green (broad band) luminescent material, that also especially substantially does not emit in the yellow, whereby surprisingly the desired level of saturation can be obtained without the use of a neodymium filter material and a gain in lumen equivalent of ~25-30% is obtainable compared to the solution using a neodymium filter. Hence, amongst others it is herein suggested not to use red LED phosphors such as $CaAlSiN_3$:$Eu^{2+}$ or $(Sr,Ca)AlSiN_3$:$Eu^2$, but to replace, or at least partly replace, by a $K_2SiF_6$:$Mn^{4+}$ or an analogues luminescent material (=phosphor).

Hence, in a first aspect the invention provides a lighting system (may also be indicated as "system"), configured to provide lighting system light, the lighting system comprising:

a light source configured to provide light source light with light intensity in the blue spectral region;

a first luminescent material configured to convert at least part of the light source light into first luminescent material light with light intensity in the green spectral region and especially having a full width half maximum (FWHM) of at least 80 nm, such as especially at least 85 nm, even more especially at least 90 nm, such as yet even more especially at least 95 nm, like at least 100 nm, such as in the range of 80-140 nm, like 90-125 nm;

a second luminescent material configured to convert (i) at least part of the light source light, or (ii) at least part of the light source light and at least part of the first luminescent material light into second luminescent material light with light intensity in the spectral region of 610-680 nm (especially having intensity at wavelengths of at least 615 nm, such as at least 620 nm), especially wherein the second luminescent material under excitation with at least part of the light source light, or (ii) at least part of the light source light and at least part of the first luminescent material light shows one or more emission lines having a full width half maximum (FWHM) at RT of 40 nm or less;

wherein the lighting system is configured to provide at a first setting of the lighting system lighting system light comprising said light source light, said first luminescent material light and said second luminescent material light especially having a color point (x;y) with x=0.38±0.1, like x=0.38±0.07, especially x=0.38±0.05, such as x=0.38±0.02 and with y=0.30±0.1, like y=0.30±0.07, especially y=0.30±0.05, such as y=0.30±0.02.

With such lighting system, (whitish) lighting system light can be generated with a relatively high efficiency and a relatively high red saturation index, and without the necessity to use an optical filter (though the use thereof is not excluded).

The lighting system comprises a light source, especially a solid state light source. The term "light source" may also relate to a plurality of light sources, such as e.g. 2-512 (solid state) LED light sources. Hence, the term LED may also refer to a plurality of LEDs. Hence, in a specific embodiment, the (one or more) light source(s) comprises solid state LED light sources (such as a LED or laser diode).

The light source is especially configured to provide blue light. Hence, the light source is especially configured to provide light source light with light intensity in the blue spectral region. The terms "blue light" or "blue emission" especially relate to light having a wavelength in the range of about 430-495 nm. Good spectral distributions leading to relative high RSI and/or lumen efficiency may especially be obtained with the light source configured to provide light source light having a dominant wavelength in the range of 455-480 nm, especially in combination with the herein described luminescent materials.

The light source is radiationally coupled with the first luminescent material and the second luminescent material. Optionally, when a plurality of light sources is applied, different light sources may radiationally be coupled with different luminescent materials, though this is not necessarily the case. Hence, in embodiments the lighting system comprises a plurality of light sources, wherein a first light source is radiationally coupled to the first luminescent material, wherein a second light source is radiationally coupled to the second luminescent material, wherein the lighting system further optionally comprises a control system configured to control the first light source and the second light source (i.e. especially control the intensity of the light of the respective light sources). The term "radiationally coupled" especially means that the light source and the luminescent material are associated with each other so that at least part of the radiation (light source light) emitted by the light source is received by the luminescent material (and at least partly converted into luminescence by the luminescent material).

The term "first luminescent material" or "second luminescent material" may each independently refer to a plurality of different luminescent materials (each complying with the herein indicated conditions for the respective "first luminescent material" or "second luminescent material").

The first luminescent material is configured to convert at least part of the light source light into first luminescent material light with light intensity in the green spectral region and especially having a full width half maximum (FWHM) of at least 90 nm. The terms "green light" or "green emission" or "in the green spectral region" especially relate to light having a wavelength in the range of about 495-570 nm. Further, it appears that good spectral distributions leading to relative high RSI and/or lumen efficiency may especially be obtained with a full width half maximum (FWHM) of at least 80 nm, such as even more especially at least 90 nm. With lower band widths, the lighting characteristics appear to be worse. Hence, the first luminescent material is especially a broad band emitter. The phrase, "light intensity the green spectral region" especially indicates that the respective luminescent material provides, upon excitation (with the blue) emission intensity in the green part of the spectrum (495-570 nm). Even more especially, the luminescence has a dominant wavelength in the green part of the spectrum (495-570 nm).

In specific embodiments, the first luminescent material under excitation with at least part of the light source light, or (ii) at least part of the light source light and at least part of the first luminescent material light, has at least 65% of the total power in the visible wavelength range of the first luminescent material light in the range of 480-580 nm. Hence, the first luminescent material is essentially emitting in the green part of the visible spectrum. Even more especially, the first luminescent material light has a dominant wavelength in the range of 540-575 nm. Hence, the first luminescent material is especially configured to provide, upon excitation, first luminescent material light having the dominant wavelength in the range of 540-575 nm.

Especially, the (first) luminescent material may comprise $M_3A_5O_{12}:Ce^{3+}$, wherein M is selected from the group consisting of Sc, Y, Tb, Gd, and Lu, wherein A is selected from the group consisting of Al, Ga, Sc and In.

Preferably, M at least comprises one or more of Y and Lu, even more especially M at least comprises Lu, and A at least comprises Al and/or Ga, even more especially A comprises at least Al, even more especially A comprises substantially only Al. In yet other embodiments, however, A comprises both Al and Ga. In yet further embodiments, A essentially comprises Ga. These types of materials may give highest efficiencies. Especially, in embodiments M consists of at least 50%, such as especially at least 75% of Lu (such as $(Y_{0.05}Lu_{0.9}Ce_{0.05})_3Al_5O_{12}:Ce^{3+}$) appears to provide good results in combination with the second luminescent material. Hence, in embodiments 75% of M consists of Lu. Especially with high Lu containing garnets, the spectral position and the full width half maximum may be as desired. With lutetium, FWHM of at least 100 nm may be achieved. Hence, the first luminescent material light especially has a full width half maximum (FWHM) of at least 100 nm. Likewise, this may apply for garnets where A substantially comprises Ga. Hence, especially the Al/Ga ratio is low when the Lu/Y ratio is low, or especially the Ga/Al ratio is low when the Y/Lu ratio. Hence, in specific embodiments the first luminescent material comprises one or more of $Lu_3Al_5O_{12}:Ce^{3+}$ and $Y_3Ga_5O_{12}:Ce^{3+}$. Alternatively or additionally, $Lu_3A_5O_{12}:Ce^{3+}$ may be applied, with A being selected of one or more of Al and Ga; increasing the Ga content may lead to dominant wavelength shifting to shorter wavelengths.

Embodiments of garnets especially include $M_3A_5O_{12}$ garnets, wherein M comprises at least yttrium and/or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3B_5O_{12}:Ce$, wherein x is equal to or larger than 0 and equal to or smaller than 1. The term ":Ce" or ":Ce^{3+}", indicates that part of the metal ions (i.e. in the garnets: part of the "M" ions) in the luminescent material is replaced by Ce. For instance, assuming $(Y_{1-x}Lu_x)_3Al_5O_{12}$:Ce, part of Y and/or Lu is replaced by Ce. This notation is known to the person skilled in the art. Ce will replace M in general for not more than 10%; in general, the Ce concentration will especially be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. The term "YAG" especially refers to M=Y and A=Al; the term "LuAG" especially refers to M=Lu and A=Al.

The first luminescent material is especially configured to absorb at least part of the light source light and convert into first luminescent material light (which is substantially green, such as with the dominant wavelength in the range of 540-575 nm).

The second luminescent material is configured to convert (i) at least part of the light source light, or (ii) at least part of the light source light and at least part of the first luminescent material light into second luminescent material light with light intensity in the red spectral region of 610-680 nm. Dependent upon the configuration of the lighting system (such as a single light source or a plurality of light sources) and/or the excitation spectrum of the luminescent material, the luminescent material may be excited by the radiation of the light source(s) and/or the luminescent material light of the first luminescent material. The second luminescent material is especially configured to provide second luminescent material light with intensity at wavelengths equal to or larger than 615 nm, even more especially equal to or larger than 620 nm, i.e. thus light intensity in the red spectra region. The terms "red light" or "red emission" especially relate to light having a wavelength in the range of about 620-780 nm. The phrase, "light intensity the red spectral region" especially indicates that the respective luminescent material provides, upon excitation emission intensity in the red part of the spectrum (620-780 nm). Even more especially, the luminescence of the second luminescent material has a dominant wavelength in the spectral region of 610-680 nm, especially at least 615 nm, such as at least 620 nm. Especially, the second luminescent material is configured to provide light source light having emission intensity at least at wavelengths over 620 nm (though there may be light intensity also at smaller wavelengths, such as in the range of 610-620 nm).

Hence, the second luminescent material is especially configured to absorb at least part of the light source light and optionally at least part of the first luminescent material light and configured (this absorbed light) into second luminescent material light. Hence, the second luminescent material has absorptions in the blue and optionally one or more of the green and yellow.

The first luminescent material and second luminescent materials are herein together also indicated as "luminescent materials". Further, the second luminescent material is especially configured to absorb relatively stronger in the blue than in the green.

Herein, the second luminescent material is especially indicated as red(dish) luminescent material. As indicated above, the second luminescent material light especially has an emission in the range of 610-680 nm. Further, it appears that good spectral distributions leading to relative high RSI and/or lumen efficiency may especially be obtained when the second luminescent material under excitation with at least part of the light source light, or (ii) at least part of the light source light and at least part of the first luminescent material light has at least 65% of the total power in the visible wavelength range of the second luminescent material light in the range of 610-680 nm, with especially at least 40% of the total power at wavelengths of at least 620 nm. Hence, the second luminescent material is essentially emitting in the red part of the visible spectrum. Even more especially, the second luminescent material light has the dominant wavelength in the range of 610-680 nm, such as in the range of 615-680 nm. Hence, the second luminescent material is especially configured to provide, upon excitation, second luminescent material light having the dominant wavelength in the range of 610-680 nm, with especially having light intensity also at wavelengths≥620 nm.

Further, the second luminescent material light especially has one or more emission lines having a full width half maximum (FWHM) at RT (room temperature) of 80 nm or less, such as 60 nm or less, especially 40 nm or less, such as 30 nm or less, like 25 nm or less. Under excitation with at least part of the light source light, or (ii) at least part of the light source light and at least part of the first luminescent material light an emission in the range of 610-680 nm will be visible in a luminescence spectrum. Tetravalent manganese shows in the (deep) red a plurality of such lines, with a dominant wavelength in the range of about 610-680 nm. Especially, the red luminescent material may thus especially be a line emitter, like systems that emit due to intra configurational transitions, as is known in the art.

Very useful red luminescent materials appeared to be Mn(IV) ("tetravalent manganese") type luminescent materials. Hence, in an embodiment the second luminescent material comprises a red luminescent material selected from the group consisting of Mn(IV) luminescent materials, even more especially the second luminescent material comprises a luminescent material of the type $M_2AX_6$ doped with tetravalent manganese, wherein M comprises an alkaline cation, wherein A comprises a tetravalent cation, and wherein X comprises a monovalent anion, at least comprising fluorine (F). For instance, $M_2AX_6$ may comprise $K_{1.5}Rb_{0.5}AX_6$. M relates to monovalent cations, such as selected from the group consisting of potassium (K), rubidium (Rb), lithium (Li), sodium (Na), cesium (Cs) and ammonium ($NH_4^+$), and especially M comprises at least one or more of K and Rb. Preferably, at least 80%, even more preferably at least 90%, such as 95% of M consists of potassium and/or rubidium. The cation A may comprise one or more of silicon (Si) titanium (Ti), germanium (Ge), stannum (Sn) and zinc (Zn). Preferably, at least 80%, even more preferably at least 90%, such as at least 95% of A consists of silicon and/or titanium (not taking into account the partial replacement by $Mn^{4+}$). Especially, M comprises potassium and A comprises titanium. X relates to a monovalent anion, but especially at least comprises fluorine. Other monovalent anions that may optionally be present may be selected from the group consisting of chlorine (Cl), bromine (Br), and iodine (I). Preferably, at least 80%, even more preferably at least 90%, such as 95% of X consists of fluorine. The term "tetravalent manganese" refers to $Mn^{4+}$. This is a well-known luminescent ion. In the formula as indicated above, part of the tetravalent cation A (such as Si) is being replaced by manganese. Hence, $M_2AX_6$ doped with tetravalent manganese may also be indicated as $M_2A_{1-m}Mn_mX_6$. The mole percentage of manganese, i.e. the percentage it replaces the tetravalent cation A will in general be in the range of 0.1-15%, especially 1-12%, i.e. m is in the range of 0.001-0.15, especially in the range of 0.01-0.12. Further embodiments may be derived from WO2013/088313, which is herein incorporated by reference. However, also other red luminescent materials may be applied. Hence, in an embodiment the second luminescent material comprises $M_2AX_6$ doped with tetravalent manganese, wherein M comprises an alkaline cation, wherein A comprises a tetravalent cation, and wherein X comprises a monovalent anion, at least comprising fluorine. Even more especially, wherein M comprises at least one or more of K and Rb, wherein A comprises one or more of Si and Ti, and wherein X=F. An example of a suitable second luminescent material is e.g. $K_2SiF_6$:Mn (5%) (i.e. $K_2Si_{(1-x)}Mn_xF_6$, with x=0.05). Here, M is substantially 100% K, A is substantially 100% Ti, but with a replacement thereof with 5% Mn (thus effectively 95% Ti and 5% Mn), and X is substantially 100% F. In specific embodiments, M is essentially K.

Therefore, in embodiments the light source is especially configured to provide light source light having a dominant wavelength in the range of 455-480 nm, the first luminescent material light has a dominant wavelength in the range of 540-575 nm, and the second luminescent material light has a dominant wavelength in the range of 610-680 nm.

The lighting system is configured to provide, at a first setting of the lighting system, lighting system light comprising said light source light, said first luminescent material light and said second luminescent material light especially having a color point (x;y) with x=0.38±0.1 and with y=0.30±0.1 (CIE 1931 coordinates). Especially with this color point, the desired lumen efficiency and/or red saturation index may be obtained. This lighting device light is white or whitish, as the color point is relatively off the black body locus BBL. Hence, in embodiments of the invention, the light generated by the lighting system may have a color point in the CIE 1931 chromaticity diagram or the 1976 CIE chromaticity diagram which is not on the black body line (well over 25 SDCM (standard deviation of color matching), such as at least 50 SDCM); this may especially be of relevance for meat lighting. For other food lighting, the color point may be closer to the BBL, such as within the range of 10-30 SDMC from the BBL. In specific embodiments, the lighting system light has a red saturation index (RSI) of at least 10, such as even more especially at least 15, such as at least 20, like even in the range of 20-35, such as 25.

The RSI (Red Saturation Index) and GSI (Green Saturation Index) are measures to indicate color over-saturation or color "exaggeration". As a reference, a halogen light, such as Philips CDM-T/TC, may be used, which reference has a RSI and GSI=0. Red and green saturation are a measure to describe that the perceived color of the product is more red or green, respectively, than the color point of the color of the product. For instance, when using some blue-yellow based light sources, the color red of a product is very pale, whereas with the present lighting system, the color red of the product is red. Likewise, this may apply to the color green of a green product. Hence, with the lighting system light, the chroma may increase; see further also P. J. M. van der Burgt et al. in Color Research & Application, Volume 35, Issue 2, pages 85-93, April 2010.

As indicated above, the lighting system is configured to provide at a first setting of the lighting system lighting system light comprising blue light, first luminescent material light and second luminescent material light. The phrase "at a first setting of the lighting system" indicates that the lighting system at least includes a single setting such as "on". Hence, the invention also provides lighting systems which have (substantially) no tunability in intensity except for "on" and "off".

A plurality of settings may especially be available when there is more than one light source.

Especially, the first and second luminescent material may be provided as separate layers or as mixtures within a single layer. The luminescent materials may also be provided at different locations within the device. In a specific embodiment, the light source comprises a solid state light source comprising a light exit surface (LED die), wherein the lighting system further comprises a converter element (herein also indicated as "converter") configured downstream from the light exit surface, wherein the converter element comprises the first luminescent material and the second luminescent material, and wherein optionally the converter element further comprises said light exit face. The converter may comprise a single layer or a plurality of layers. Likewise this may apply to optional further luminescent materials.

Optionally, the lighting system may include one or more further luminescent materials, especially configured to provide (further) luminescent light upon excitation with one or more of the light source light and the first luminescent material light. Alternatively or additionally, the lighting system may also include one or more further light sources, especially solid state light sources, to provide especially visible light. The optional one or more further luminescent materials and/or the optional one or more further light sources may especially be used to further tune the spectral distribution of the lighting system light, though alternatively or additionally, the optional one or more further luminescent materials and/or the optional one or more further light sources may especially be used to provide one or more further light settings (for instance a light setting wherein lighting system light is generate that is close or on the black body locus). Hence, the lighting system may include one or more of a third luminescent material (radiationally coupled with the one or more light sources) and a further light source (especially not radiationally coupled to the first luminescent material, second luminescent material and optionally third luminescent material).

Herein, the terms "setting" or "setting" may especially refer to the power provided to the one or more (solid state) light sources and optionally additionally (solid state) light sources (further light source(s)).

In yet a further embodiment, the lighting system may further comprise a control system configured to control the power provided to the (one or more) (solid state) light sources. Alternatively or additionally, the control system may be external from the lighting system. Optionally, the control system may comprise a plurality of elements, of which some may be comprised by the lighting system and others may be external from the lighting system (such as a remote user interface, see also below). Optionally, also the power may be included in the lighting system, such as in the case of certain handheld flash lights. The lighting system may e.g. be integrated in a lighting system with a plurality of lighting system and optional other type of lighting systems than described herein.

In yet a further specific embodiment, the control system is configured to control the power provided to the one or more (solid state) light sources as function of an input signal of a user interface. This user interface may be integrated in the lighting system, but may also be remote from the lighting system. Hence, the user interface may in embodiments be integrated in the lighting system but may in other embodiments be separate from the lighting system. The user interface may e.g. be a graphical user interface. Further, the user interface may be provided by an App for a Smartphone or other type of android device. Therefore, the invention also provides a computer program product, optionally implemented on a record carrier (storage medium), which when run on a computer executes the method as described herein (see below) and/or can control (the color temperature of the lighting system light of) the lighting system as described herein (as function of the power provided to the one or more (solid state) light sources).

Alternatively or additionally, the control system is configured to control the power provided to the one or more (solid state) light sources as function of one or more of a sensor signal and a timer. To this end, e.g. a timer and/or a sensor may be used. For instance, the timer may be used to switch off after a predetermined time. Further, for instance the sensor may be a motion sensor, configured to sense motion, with the control system configured to switch on the lighting system when the motion sensor senses motion or presence of e.g. a person. Further, the sensor may be an optical sensor, e.g. to sense the light, especially the lighting system light, reflected by a product (illuminated with the lighting system light).

The lighting system especially comprises a light exit surface. This may be the downstream face of a window, optionally comprising one or more of the luminescent materials and/or comprising one or more of the luminescent materials at an upstream side of the window, such as a coating to the upstream face of the window. Also combinations of such embodiments are possible. For instance, the window may comprise a light transmissive material, such as a light transmissive polymeric material, like PMMA, or a ceramic material. Hence, the window is especially a polymeric material. However, in another embodiment the window (material) may comprise an inorganic material. Preferred inorganic materials are selected from the group consisting of glasses, (fused) quartz, transmissive ceramic materials, and silicones. Also hybrid materials, comprising both inorganic and organic parts may be applied. Especially preferred are PMMA, transparent PC, or glass as material for the window. Hence, the lighting system may comprise a lighting device comprising the light source, the first luminescent material and the second luminescent material, and especially also the light exit surface. Hence, in further specific embodiments the lighting system consists of a lighting device.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The light exit face (of the lighting system) is herein also indicated as "light outcoupling face". Especially, the lighting system is configured to provide lighting system light ("device light") downstream from said light exit face. This light may be perceived by a user. Optionally, downstream from the window optics may be configured, such as beam shaping optics. The lighting system light comprises one or more of said light source light, said first luminescent material light, and said second luminescent material light. As indicated above, especially the lighting system light comprises white light, with optionally a variable color temperature.

As indicated above, with the present invention an optical filter to (further) tune the spectral distribution of the lighting system light may not be necessary. Hence, in specific embodiment the lighting system as described herein is provided without including an optical filter configured downstream from the luminescent materials with the optical filter being configured to reduce along an optical axis of the optical filter one or more of the ratio's (i) yellow light to green light, and (ii) yellow light to red light.

The lighting system may especially be used for illuminating a product having a red color, such as for illuminating meat, or for illuminating tomatoes, strawberries, bell peppers, etc. With the present lighting system light, the red color of the (food) product will not appear pale but natural and/or bright red. However, the lighting system may also be used for illuminating non-food products, such as e.g. a red car, a red wall, etc. The lighting system may be used in e.g. shops, warehouses, etc. Hence, in yet a further aspect the invention also provides a show case comprising the lighting system as defined herein.

Further, the terms "yellow light" or "yellow emission" especially relate to light having a wavelength in the range of about 570-590 nm. The terms "orange light" or "orange emission" especially relate to light having a wavelength in the range of about 590-620 nm. The term "pink light" or "pink emission" refers to light having a blue and a red component. The terms "visible", "visible light" or "visible emission" refer to light having a wavelength in the range of about 380-780 nm. For visible light, the terms "radiation" and "light" may be used interchangeably.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
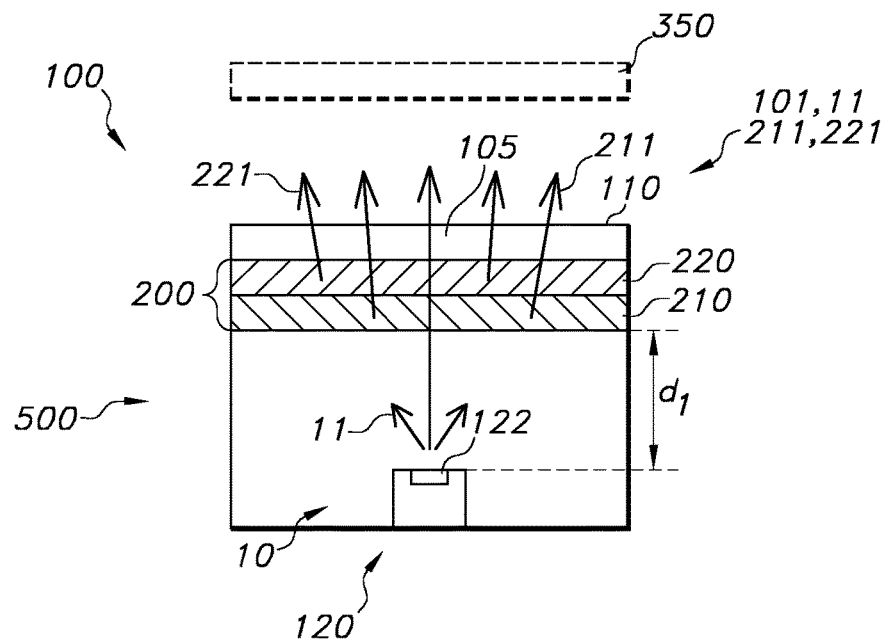
FIGS. 1a-1d schematically depicts some aspects of the invention.

FIG. 1a schematically depicts an embodiment of a lighting system 100 as described herein. The lighting system 100 comprises a light source 10 configured to provide blue light source light 11, a first luminescent material 210 configured to convert at least part of the light source light 11 into first luminescent material light 211 with light intensity in the green spectral region and a second luminescent material 220 configured to convert (i) at least part of the light source light 11, or (ii) at least part of the light source light 11 and at least part of the first luminescent material light 211 into second luminescent material light 221 with light intensity in the red spectral region.

Figure 1B:
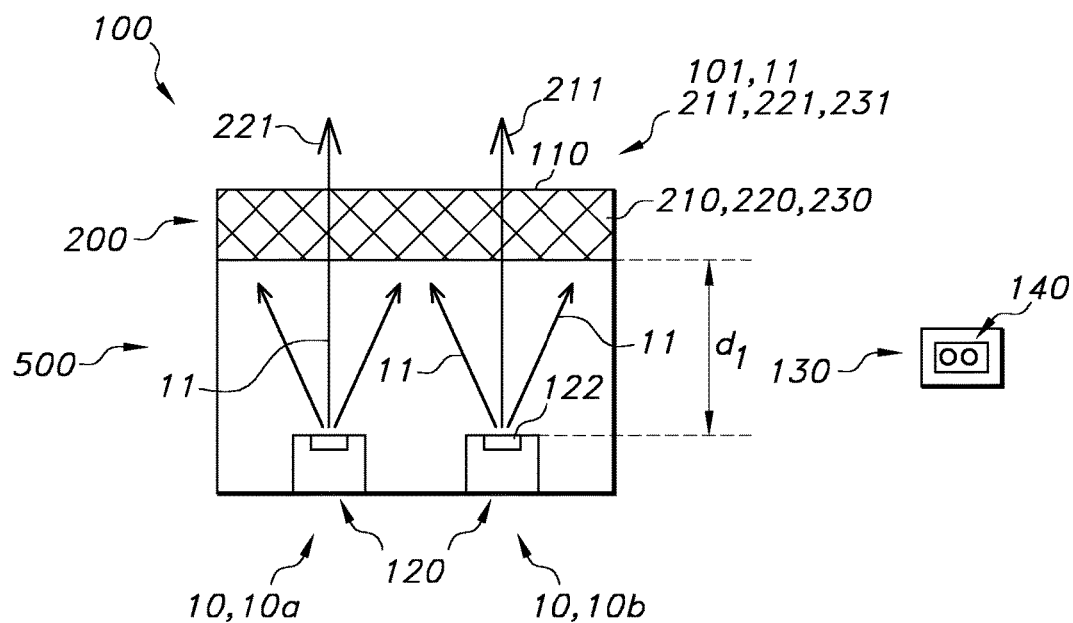

Further, the lighting system comprises a light exit face 110. Herein in the embodiment of FIG. 1a, this may be the downstream face of a window 105. In FIG. 1b this is the downstream face of a converter 200. Here, in FIGS. 1a-1b the converter 200 comprises the first luminescent material 210 and the second luminescent material 220, e.g. a layers (FIG. 1a), or as mixture (FIG. 1b). Note that the converter 200 may also include materials and/or layers other than the first luminescent material 210 and the second luminescent material 220. In FIG. 1a, the converter is configured upstream of the light exit face, here upstream of window 105. Especially, when using separate layers of the first luminescent material 210 and the second luminescent material 220, the latter is configured downstream of the former, in order to further facilitate absorption of the first luminescent material light 211. Would the second luminescent material 220 substantially not absorb first luminescent material light 211, then the order of the layers may also be reversed. Further, also mixtures may be applied (see FIG. 1b). However, in other embodiments when using separate layers of the first luminescent material 210 and the second luminescent material 220, the former may also be configured downstream of the latter, e.g. better control reabsorption and/or to provide a higher CRI.

Further, the lighting system 100 is configured to provide lighting system light 101 downstream from said light exit face 110. Here, as shown in FIG. 1a, the lighting system light 101 comprises one or more of said light source light 11, said first luminescent material light 211, and said second luminescent material light 221. Hence, the lighting system 100 may produce lighting system light 101 comprising blue light source light 11, first luminescent material light 211 and second luminescent material light 221, which may especially be white light.

Optionally, the lighting system may further comprise a third luminescent material 230, configured to provide third luminescent material light 231 upon excitation with one or more of the light source light 11 and the first luminescent material light 211, wherein the third luminescent material 230 is a broad band emitter in the orange and/or red, as schematically depicted in FIG. 1b. Hence, the lighting system 100 may produce lighting system light 101 comprising blue light source light, first luminescent material light 211, second luminescent material light 221, and third luminescent material light 231, which may especially be white light.

The distance between (the light source 10 and) the first and/or the second luminescent materials is indicated with reference d1, which may be in the range of 0.1-50 mm, especially 1-20 mm in e.g. the embodiment of FIGS. 1a-1b. In the schematically depicted embodiment, the distance d1 is the distance between a light exit surface 122 of a solid state light source 120. However, d1 may also be zero (i.e. the luminescent material in physical contact with the light exit surface 122).

Reference 500 refers to a device. The lighting system 100 may comprise a device, and optionally other components, such as other light sources, etc. The device 500 is especially configured to provide lighting system light 101, the lighting device comprising the light source 10 configured to provide said light source light 11 with light intensity in the blue spectral region; the first luminescent material 210 configured to convert at least part of the light source light 11 into said first luminescent material light 211 with light intensity in the green spectral region and having a full width half maximum FWHM of at least 90 nm; the second luminescent material 220 configured to convert i at least part of the light source light 11, or ii at least part of the light source light 11 and at least part of the first luminescent material light 211 into said second luminescent material light 221 with light intensity in the spectral region of 610-680 nm; wherein the lighting system 100 is configured to provide at a first setting of the lighting system 100 said lighting system light 101 comprising said light source light 11, said first luminescent material light 211 and said second luminescent material light 221, especially having a color point (x;y) with x=0.38±0.1 and with y=0.30±0.1. The color point is (thus) for substantially all relevant embodiments described herein below the BBL.

With a dashed line, an optical (yellow) filter 350 is depicted. As mentioned above, such filter is not necessary with the solution of the present invention, though of course such filter might be applied.

FIG. 1b schematically further depicts a control system 130, which may include a user interface 140. Optionally, the user interface may also be usable remote from the control system.

FIG. 1a shows an embodiment, schematically including a single light source 100 configured to provide the light source light 11. FIG. 1b schematically depicts an embodiment using two light source configured to provide the light source light 11. Hence, FIG. 1b schematically depicts an embodiment with a light source 10a configured to provide blue light source light 11 and a second light source 10b configured to provide also blue light source light 11.

Figure 1C:
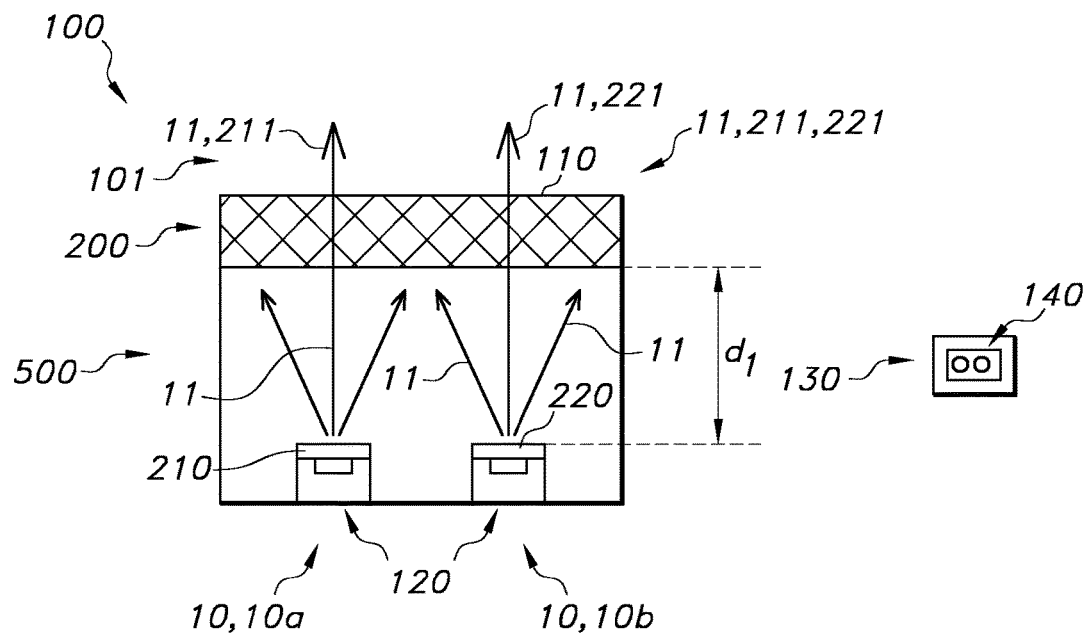

FIG. 1c schematically depicts an embodiment wherein the first luminescent material 210 is radiationally coupled with a first light source 10a, and wherein the second luminescent material 220 is radiationally coupled with a second light source 10b, both light sources 10a,10b configured to provided blue light source light 11. For further elucidation of this graph it is referred to FIGS. 1a-1b.

Figure 1D:
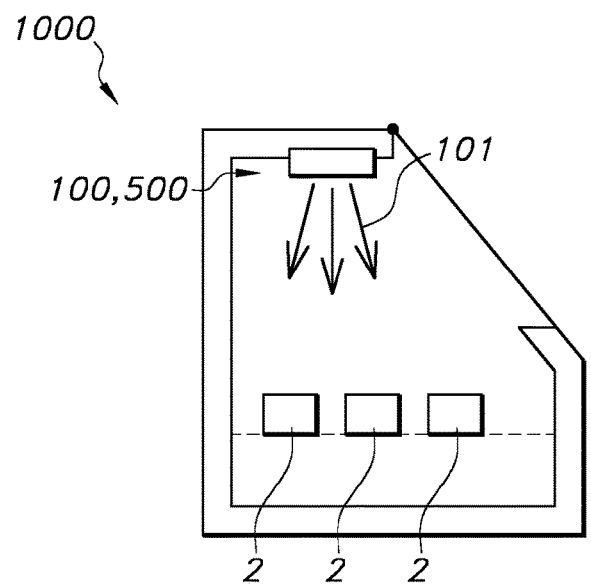

FIG. 1d schematically depicts a show case 1000 comprising the lighting system 100. Products, such as meat, are indicated with references 2.

FIGS. 1a-1d are very schematic drawings. The embodiments schematically depicted may include more light sources and may have other dimensions, etc.

EXAMPLES

Figure 2:
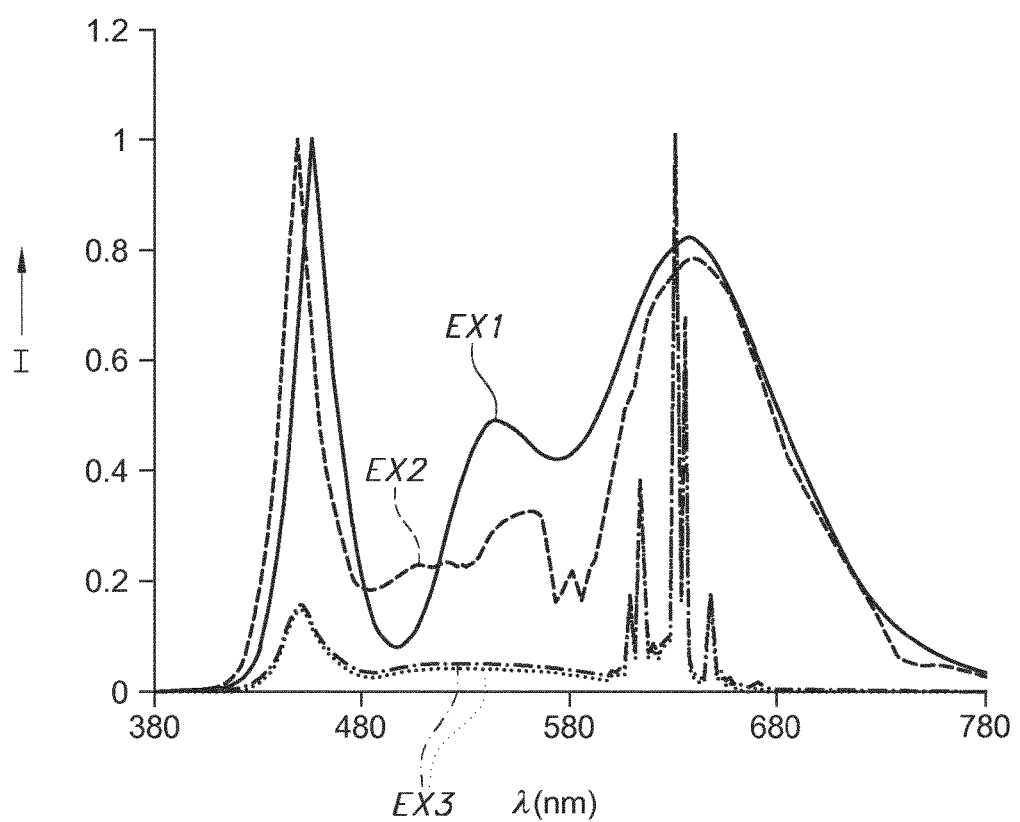
FIG. 2 depicts some examples and reference examples.

A meat lighting solution based on β-SiAlON and a nitride phosphor (see example 1 in the table below) is depicted in FIG. 2. The lumen equivalent of the spectrum is 285 Lm/W. The level of oversaturation (RSI) is limited to ~10. These specifications are less than desired, as especially the RSI should be higher, without too much loss of the efficiency. An improved solution with improved oversaturation but low efficiency (neodymium filter) is also given in FIG. 2 (see example 2 in the table below). The dip around 580 nm is generated by a neodymium doped glass. The lumen equivalent drops to 190 Lm/W. The level of red saturation that can be reached is (for the current filter level) around 25. An improvement solution using $K_2SiF_6:Mn^{4+}$ is also shown in FIG. 2 (see example 3 in the table below). The lumen equivalent increases to 240 Lm/W, at a red saturation of ~25. Compared to the solution with neodymium a 30% increase in efficiency. Example 3 was done twice with two lutetium garnets with slightly different chemical compositions (see FIG. 2). An LED with peak maximum 454 nm was chosen, but other LEDs may also be chosen. Further examples are also described in the below table.

| Ex. | Blue (peak maximum) | Green (dominant wavelength) (FWHM) | Red (dominant wavelength) | Optical filter | Color point | Lumen equivalent (Lm/W) | RSI |
|---|---|---|---|---|---|---|---|
| 1 | LED (454 nm) | ß SiAlON:Eu (547 nm) (50 nm) | eCAS BR101b (CaAlSiN$_3$:Eu) (618 nm) | − | 0.38; 0.28 | 285 | 10 |
| 2 | LED (454 nm) | LuAG (553 nm) (110 nm) | eCAS BR101b (CaAlSiN$_3$:Eu) (618 nm) | + | 0.38; 0.28 | 190 | 25 |
| 3 | LED (454 nm) | LuAG (554/560 nm) (110 nm) | K2SiF6:Mn (622 nm) | − | 0.38; 0.28 | 240 | 25 |
| 4 | LED (454 nm) | LuGaAg (557 nm) (110 nm) | M2SiF6:Mn (M = K, Rb) (622 nm) | − | 0.38; 0.28 | 236 | 25 |

The combination of the red luminescent material M$_2$SiF$_6$ with β-sialon:Eu or (Ba,Sr)$_2$SiO$_4$:Eu were also evaluated. It appeared however that these combinations were less desirable, amongst others also in terms of quantum efficiency (of the green luminescent material), blue absorption (of the green luminescent material), temperature stability (quenching) (of the green luminescent material).

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

The invention claimed is:

1. A lighting system, configured to provide lighting system light, the lighting system comprising:
    a light source configured to provide light source light with light intensity in the blue spectral region;
    a first luminescent material configured to convert at least part of the light source light into first luminescent material light with light intensity in the green spectral region and having a full width half maximum of at least 90 nm;
    a second luminescent material configured to convert (i) at least part of the light source light, or (ii) at least part of the light source light and at least part of the first luminescent material light into second luminescent material light with light intensity in the spectral region of 610-680 nm, wherein the second luminescent material under excitation with at least part of the light source light, or at least part of the light source light and at least part of the first luminescent material light shows one or more emission lines having a full width half maximum (FWHM) at RT of 40 nm or less;
    wherein the lighting system is configured to provide at a first setting of the lighting system lighting system light comprising said light source light, said first luminescent material light and said second luminescent material light having a color point (x;y) with x=0.38±0.1 and with y=0.3±0.1; and
    wherein the first luminescent material under excitation with at least part of the light source light, or at least part of the light source light and at least part of the first luminescent material light has at least 65% of the total power in the visible wavelength range of the first luminescent material light in the range of 480-580 nm.

2. The lighting system according to claim 1, wherein the first luminescent material comprises $M_3A_5O_{12}:Ce^{3+}$, wherein M is selected from the group consisting of Sc, Y, Tb, Gd, and Lu, and wherein A is selected from the group consisting of Al, Ga, Sc and In.

3. The lighting system according to claim 2, wherein the first luminescent material comprises one or more of $Lu_3Al_5O_{12}:Ce^{3+}$ and $Y_3Ga_5O_{12}:Ce^{3+}$.

4. The lighting system according to claim 2, wherein the first luminescent material light has a full width half maximum (FWHM) of at least 100 nm.

5. The lighting system according to claim 1, wherein the second luminescent material under excitation with at least part of the light source light, or at least part of the light source light and at least part of the first luminescent material light has at least 40% of the total power in the visible wavelength range of the second luminescent material light in the range of 620-680 nm.

6. The lighting system according to claim 1, wherein the first luminescent material has a dominant wavelength in the range of 540-575 nm, wherein the lighting system is configured to provide at the first setting of the lighting system lighting system light comprising said light source light, said first luminescent material light and said second luminescent material light having a color point (x;y) with x=0.38±0.02 and with y=0.3±0.02.

7. The lighting system according to claim 1, wherein the second luminescent material comprises $M_2AX_6$ doped with tetravalent manganese, wherein M comprises an alkaline cation, wherein A comprises a tetravalent cation, and wherein X comprises a monovalent anion, at least comprising fluorine.

8. The lighting system according to claim 7, wherein M comprises at least one or more of K and Rb, wherein A comprises one or more of Si and Ti, and wherein X=F.

9. The lighting system according to claim 1, comprising a plurality of light sources, wherein a first light source is radiationally coupled to the first luminescent material, wherein a second light source is radiationally coupled to the second luminescent material, wherein the lighting system further comprises a control system configured to control the first light source and the second light source.

10. The lighting system according to claim 1, without including an optical filter configured downstream from the luminescent materials with the optical filter being configured to reduce along an optical axis of the optical filter one or more of the ratio's (i) yellow light to green light, and (ii) yellow light to red light.

11. A show case comprising the lighting system according to claim 1.

12. Use of the lighting system according to claim 1, for illuminating a product having a red color.

13. Use according to claim 12, for illuminating meat.

* * * * *